Sept. 29, 1959 R. H. MATTSON 2,906,893

TRANSISTOR BLOCKING OSCILLATOR

Filed July 6, 1956 2 Sheets-Sheet 1

INVENTOR
R. H. MATTSON
BY Patrick J. Roche
ATTORNEY

INVENTOR
R. H. MATTSON
BY Patrick J. Roche
ATTORNEY

United States Patent Office 2,906,893

Patented Sept. 29, 1959

2,906,893

TRANSISTOR BLOCKING OSCILLATOR

Roy H. Mattson, New Providence, N.J., assignor to Bell Telephone Laboratories, Incorporated, New York, N.Y., a corporation of New York Application July 6, 1956, Serial No. 596,213

15 Claims. (Cl. 307—88.5)

This invention relates to transistor amplifiers, and more specifically to improved signal input connections for transistor, regenerative, pulse amplifiers such as blocking oscillators.

Certain computer circuits employ a great many logic units, such as And and Or circuits, to carry out the specific computer operations. However, the logic circuits also act as lossy filters which distort the pulses passing therethrough. For this reason, pulse regenerating amplifiers are employed between the various logic stages to restore the sharp pulse shape needed for subsequent computer operations. In certain cases the pulse regenerators also retime the pulses.

Transistor blocking oscillators are often used as pulse regenerators because they can generate sharp rectangular pulses while displaying switching times of as little as a fraction of a microsecond and because the oscillator output wave shape is a function of oscillator parameters rather than the shape of the input pulse. A blocking oscillator normally employs input and output circuits which are coupled together by regenerative feedback circuitry. The feedback circuitry may include a mutual inductance device such as a feedback transformer having a first winding connected in series in the input circuit and a second winding connected in series in the output circuit. Triggering pulses can be applied to the blocking oscillator input circuit by inductive coupling to the first feedback transformer winding or by electrical connection to a transistor electrode. Both inductive and electrical coupling involve some difficulty. For example, if input pulses from the logic circuits are inductively coupled to the input circuit winding of the feedback transformer, the logic circuit impedance, which may be relatively low, is reflected into the oscillator input circuit in shunt with the feedback transformer windings thus reducing the oscillator regenerative feedback action. If the input pulse is applied directly to the transistor blocking oscillator input circuit by electrical means, a diode must be connected in series in the feedback loop in order to direct triggering current from the logic circuitry in the proper direction through the oscillator input circuit, and the presence of the additional resistance of the diode in series with the feedback circuit increases the oscillator switching time.

In certain forms of logic circuitry, such as And circuits, the source of logic bias potential employed is larger than would be required just to supply And circuit bias because it also supplies the current necessary to trigger the following pulse regenerator. Often the logic circuit source also supplies at least part of the current required by the pulse regenerator to maintain conduction during the pulse regeneration interval. Thus, the extra size of the And circuit biasing source needed to trigger the regenerator represents an element of cost in itself, as well as wasted power dissipation in the And circuit impedances prior to triggering.

It is therefore one object of the present invention to improve transistor, regenerative, pulse amplifier triggering connections.

Another object is to increase transistor, regenerative, pulse amplifier switching reliability.

Another object is to reduce the power requirements for triggering transistor blocking oscillators.

A further object is to reduce the switching time of a blocking oscillator.

In carrying out the present invention in an exemplary embodiment thereof, a transistor including a base, an emitter, and a collector, and a multiwinding transformer are connected in circuit with an And logic circuit and two sources of signals therefor, one source supplying an alternating timing signal and the other source a positive triggering signal pulse. One transformer winding is connected in circuit with the And circuit and the two signaling circuits. A second transformer winding couples the first transformer winding to the emitter, and a third transformer winding couples the collector to the second transformer winding and thereby provides a feedback circuit between the collector and emitter. The collector is also separately coupled to a load. In the absence of a triggering pulse, there is no potential difference between the base and emitter so there is no conduction therebetween and the oscillator is normally biased in a stable, nonoscillatory condition. In the latter condition, a source of direct-current potential in the And circuit establishes a steady magnetic field around the turns of the one transformer winding whereby electrical energy is stored therein. Simultaneously therewith the latter source supplies a positive or forward bias to a unidirectional device which is also included in the And circuit and which is now said to be in a low impedance condition.

In the operation of the aforenoted circuitry, a positive triggering pulse, supplied by the other signaling source to the circuit in cooperation with the alternating current signal, supplied by the one signaling source, biases the unidirectional device to a high impedance condition thereby substantially attenuating the charging current in the one transformer winding to such extent that the charging circuit thereof is effectively interrupted. This tends to reduce the amount of current flowing in the one transformer winding and thereby substantially reduces the magnetic field around the latter winding. As a further consequence, the amount of electrical energy stored in the one transformer winding tends to change whereby a voltage is induced in the latter winding. This voltage tends to maintain the current flow in the one transformer winding.

The voltage induced in the one transformer winding is coupled via the second transformer winding to the emitter. The coupled voltage biases the emitter into conduction whereby an increased current is caused to flow in the collector and base circuits to increase correspondingly the voltage coupled to the load. The increase in collector current initiates regenerative feedback from the collector to the emitter through the feedback circuit to increase further the current flow in the collector circuit and thereby further increase the voltage coupled to the load. The oscillator is now said to be in an unstable oscillatory condition. Upon the termination of the triggering voltage, the unidirectional device of the And circuit is returned to the low impedance condition to discontinue the feedback voltage and thereby enable the direct-current source again to store electrical energy in the one transformer winding and reestablish the stable condition for the oscillator to await the arrival of the next succeeding triggering pulse.

In another embodiment of the invention, the pulse regenerator described above is modified by the addition of high and low resistance bias sources connected in parallel with one another between the base and the teminal of the second transformer winding which is remote from the emitter electrode. In the absence of a triggering pulse there is limited conduction through the high resistance bias source which holds the oscillator in a stable, nonoscillatory condition. The increase in base current upon the application of triggering energy to the second transformer winding causes the effect of the low resistance base bias source to override that of the high resistance base bias source thereby biasing the oscillator portion of the pulse regenerator into its unstable oscillatory condition to generate a voltage pulse which is coupled to the load as in the manner before described.

The construction and operation of the invention will be appreciated more fully upon a consideration of the following detailed description when read in connection with the attached drawings in which.

Figure 1:
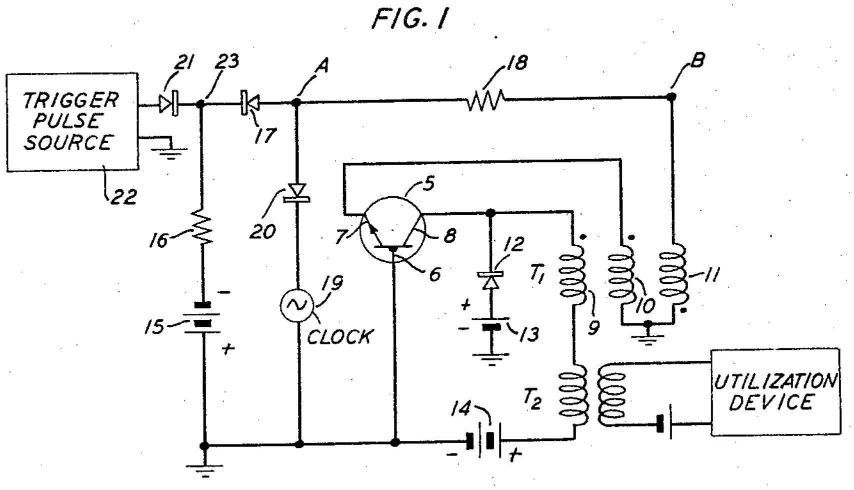
Fig. 1 is a circuit diagram of a regenerative pulse amplifier in accordance with the invention.

Referring to Fig. 1, there is illustrated a regenerative pulse amplifier which includes a conventional, single-swing, transistor blocking oscillator which, for example, is similar to the typical transistor blocking oscillator illustrated on page 1632 in Fig. 1 of an article by J. G. Linvill and R. H. Mattson entitled "Junction Transistor Blocking Oscillators" in the November, 1955, issue of Proceedings of the Ire. The active oscillator element in Fig. 1 of the drawings attached hereto is an n-p-n junction transistor 5 having base, emitter, and collector electrodes 6, 7, and 8, respectively. Regenerative feedback from collector 8 to emitter 7 is provided by the mutual inductance coupling of a transformer $T_1$ having a primary winding 9 and two secondary windings 10 and 11, the last-mentioned coupling being effected by windings 9 and 10. Corresponding terminals of secondary windings 10 and 11 are connected to ground. The collector circuit is coupled to a suitable utilization device by means of a transformer $T_2$. A conventional limiter circuit comprising diode 12 and direct-current potential source 13 is connected to collector electrode 8 to prevent excessive collector potential excursions. A direct-current potential source 14 has its negative terminal connected to base 6 and its positive terminal connected to collector electrode 8 through the primary windings of transformers $T_1$ and $T_2$ whereby the latter electrode is suitably positively biased.

In accordance with the present invention the regenerative pulse amplifier of Fig. 1 also includes a unique oscillator input circuit which provides triggering bias for emitter electrode 7. The terminals of an inductance, which in this case is the secondary winding 11 of transformer $T_1$, are connected so as to form an And logic circuit which comprises, in addition to secondary winding 11, a direct-current potential source 15, a resistor 16, a diode 17, and a resistor 18. Source 15 supplies bias for the And circuit diode 17 and charging current for winding 11. Diode 17 is connected in series between the resistors 16 and 18 and is poled for forward conduction of the current from source 15.

One of two And circuit input signals is provided by a source 19 of clocking alternating-current voltage which has one terminal connected to ground and another terminal connected via diode 20 to junction A between diode 17 and resistor 18. Diode 20 is poled for conduction from junction A to clock source 19. Another And circuit input signal is provided by trigger pulse source 22 which is connected via diode 21 to jounction 23 between resistor 16 and diode 17. The And circuit input signal supplied by clock source 19 is not essential to the operation of this invention, but it is generally used with regenerative amplifiers working as pulse regenerators in synchronized computer systems wherein it is necessary for a plurality of such circuits to be triggered simultaneously. The synchronization will be discussed more completely later in connection with the operation of the circuit of Fig. 1.

In the absence of triggering pulses there is no potential difference between base 6 and emitter 7, both being effectively at ground potential, so transitor 5 is nonconducting except for a normal $I_{co}$ current flowing in its collector-base circuit. Source 15 biases diode 17 to a low impedance or On condition. The quiescent And circuit current supplied by source 15 flows through the series circuit including the positive terminal of source 15, ground, winding 11, resistor 18, diode 17, resistor 16, and the negative terminal of source 15.

The And circuit current flowing in winding 11 establishes a steady magnetic field around the turns thereof. Although there is no substantial voltage between the terminals of winding 11, it is said to be a charged inductance because of the energy stored in the magnetic field established therearound. Any change in the current in winding 11 tends to change the energy stored in the surrounding magnetic field thereby inducing a potential in winding 11 which is opposite to the change in applied potential causing the current change as is well known in electric circuit art.

The quiescent direct current from source 15 is supplemented at regular intervals by a component of alternating current from clock source 19 during the negative portion of its cycle. The output of source 19 is generally sinusoidal, and the charging current component supplied thereby varies gradually between small amplitude limits so that transistor 5 cannot be triggered into conduction by that variation alone.

Figure 2:
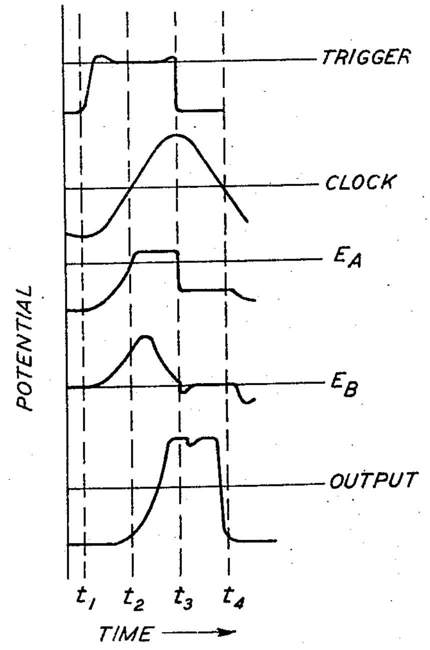
Fig. 2 is a family of voltage waveforms illustrating the operation of the invention in Fig. 1.

The operation of the pulse regenerator upon the application of a triggering pulse to the And circuit from source 22 will be apparent from a consideration of the circuit of Fig. 1 in connection with the voltage wave diagrams of Fig. 2 in which the horizontal lines are the zero axes.

While the regenerative amplifier is in its Off condition, the And gate curernt flows through winding 11 and diode 17 from source 15 as was explained above. A positive trigger pulse is now applied to the And circuit by source 22 through diode 21 at time $t_1$ whereby diode 17 is counter biased to its high impedance or Off condition. This cuts off the current flowing in the transformer winding 11 from the source 15 in the circuit above traced. The voltage $E_B$ at junction B would normally tend to rise abruptly in the same fashion as the triggering pulse, but this tendency is restrained by the continued conduction of current through diode 20 from clock source 19 at time $t_1$. The voltages $E_A$ and $E_B$ at junctions A and B, respectively, start to change in a positive direction as shown in Fig. 2 but the component of charging current from clock source 19 tends to inhibit the triggering action until time $t_2$ to insure simultaneous triggering of all pulse regenerators that may be under the control of source 19. As the voltage $E_A$ changes in a positive direction approaching zero with the clock voltage, the voltage $E_B$ also tends to change in a positive direction becoming larger than zero because the latter voltage is representative of the net electromotive force induced in winding 11 by the abrupt attenuation of the current component from source 15 and the sinusoidal decrease in the current supplied by clock source 19. The voltage $E_B$ is coupled through winding 10 of transformer $T_1$ to the emitter electrode 7 where it causes current to flow as indicated by the slight increase in the output pulse just prior to time $t_2$, but this current is not sufficient to initiate regeneration.

Clock source 19 passes through zero at time $t_2$ and shortly thereafter diode 20 reverts to its Off or high impedance condition. With both diodes 17 and 20 in the Off condition at the same time, the flow of charging current in winding 11 from sources 15 and 19 is interrupted. The magnetic lines of force around the turns of winding 11 collapse thereby changing the energy stored therein. This increases the voltage $E_B$ therein tending to maintain current flow in transformer winding 11. The latter voltage coupled to emitter 7 via transformer winding 10 drives more current through emitter 7 triggering the blocking oscillator into an unstable conduction condition. Now, as the collector-base current increases, the output voltage applied to the utilization circuit via transformer $T_2$ begins to rise correspondingly, and regenerative action (i.e., positive feedback from collector to emitter) begins as a result of the coupling between windings 9 and 10 in the collector and emitter circuits, respectively, of transistor 5. This regenerative action tends to increase further the current flow in the collector-base output circuit whereby the output voltage supplied by transformer $T_2$ to the utilization device tends to rise considerably.

When the triggering pulse is terminated at time $t_3$, diode 17 returns to the On condition. The oscillator tends briefly to turn Off, as indicated by the dimple in the uppermost portion of the output voltage waveform in Fig. 2 just after time $t_3$, because the buildup of current from the And gate source in winding 11 induces a voltage in winding 10 in the feedback loop. This tends to place a positive, or reverse, bias on emitter 7 and thereby reduce the regenerative feedback action. However, the charging current in winding 11 stabilizes quickly and the oscillator remains in the unstable condition for a short time longer. The output pulse starts to decrease before the clock voltage passes through zero at time $t_4$, possibly because the On condition of diode 17 provides a conduction path through winding 11 and source 15 of the And circuit. The impedance of the latter path reflected back to the emitter circuit tends to reduce the current flowing in the normal emitter current path which includes emitter 7, base 6 and secondary winding 10. When diode 20 conducts once more at time $t_4$, the current flow in winding 11 is increased still further, thereby reducing still more the current flowing in the emitter 7 until transistor 5 can no longer support conduction. The output pulse is then terminated and the regenerative amplifier is restored to its stable Off condition.

Thus, some of the energy normally used to bias the And logic circuitry controlling the regenerative amplifier is stored in the magnetizing inductance of winding 11 while the amplifier is resting in its stable Off condition, and the stored energy is used to trigger the amplifier at the selected time. This triggering method eliminates the need for large blocking oscillator triggering currents without materially reducing the blocking oscillator switching time. It also reduces the current drain on the And logic circuit bias source during the triggering interval because current from And circuit source 15 is not utilized to supply emitter current during triggering.

The entire triggering and regeneration period from time $t_1$ to time $t_4$ can be made less than one microsecond. If the regenerative amplifier were operating independently of any synchronized system, clock source 19 could be eliminated, and the length of the output pulse could be made a function of the mutual inductance of the feedback transformer $T_1$.

Figure 3:
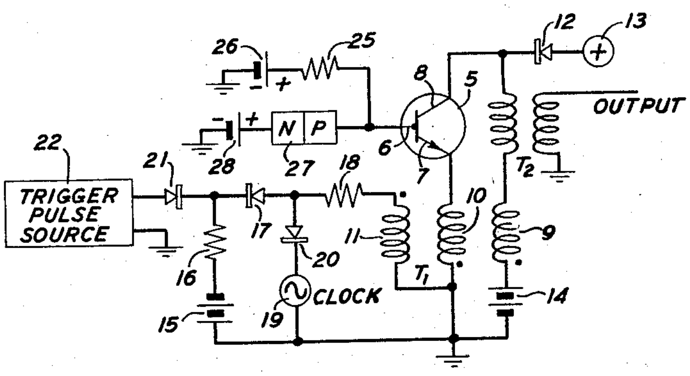
Fig. 3 is a circuit diagram of another embodiment of the invention.

Fig. 3 illustrates a modification of the invention wherein the blocking-oscillator triggering time is decreased compared to that of the embodiment illustrated in Fig. 1 by biasing the blocking oscillator into conduction while in its stable state. Otherwise, the operation of the modification in Fig. 3 is similar to the operation described in connection with Fig. 1. Wherever circuit elements in Fig. 3 correspond to those of Fig. 1 like reference numerals have been applied.

Figure 4:
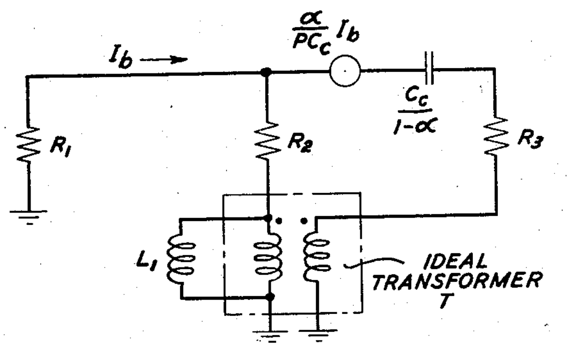
Fig. 4 is an equivalent circuit of part of the circuit of Fig. 3.

It has been found that if the resistance connected in series in one of the electrode circuits of a transistor blocking oscillator is made sufficiently large, the blocking oscillator can be held in a stable conducting condition. In Fig. 4 there is illustrated an equivalent circuit for a transistor blocking oscillator of the type employed in the regenerative amplifier illustrated in Fig. 3. Referring to Fig. 4 resistors $R_1$, $R_2$ and $R_3$ are the resistances in series with the transistor base electrode 6, emitter electrode 7, and collector electrode 8, respectively, in Fig. 3. Resistor $R_1$ includes the internal base resistance of transistor 5 and the external resistance in series with base electrode 6 represented by resistor 25 and diode 27. Resistor $R_2$ represents the internal emitter resistance of transistor 5; and resistor $R_3$ represents the oscillator load resistance. The current generator $$\frac{\alpha}{pC_c}I_b$$

and the capacitor $$\frac{C_c}{1-\alpha}$$

are the equivalent circuit representation of collector electrode 8 in Fig. 3. In the latter representation, $\alpha$ is the transistor current gain; $I_b$ is the base current; $C_c$ is the inherent collector electrode capacitance; and $p$ is the frequency in radians per second. An ideal transformer T and magnetizing inductance $L_1$ provide the equivalent circuit representation of feedback transformer windings 9 and 10 in Fig. 3. In order to simplify the equivalent circuit analysis in Fig. 4, it is assumed that the emitter electrode resistance, the collector electrode resistance, and the resistance and capacitance of transformer $T_1$ in Fig. 3 may be neglected. The actual operation of the resultant circuit so closely approximates the predetermined theoretical operation that the assumption is justified.

The stability criterion for the circuit of Fig. 4 can be obtained by using circuit analysis techniques such as, for example, those outlined in chapters 7 and 8 of "Network Analysis and Feedback Amplifier Design" by H. W. Bode, D. Van Nostrand Co., Inc., 1945. Thus assuming that $R_2=0$, the stability criterion for the oscillator can be shown to be:

$$\frac{p_0C_cR_1R_3+R_1+p_0L_1(1-\alpha_0N)}{C_cL_1(R_3+(N-1)^2R_1)}\leq\frac{R_1p_0(1-\alpha_0)}{p_0\tau_1+L_1+C_cR_1R_3} \qquad (1)$$

where $$\alpha=\frac{\alpha_0}{1+\frac{p}{p_0}}$$

$p_0=2\pi f_{co}$ $\tau_1=C_cL_1(R_3+(N-1)^2R_1)$ $f_{co}$=transistor cutoff frequency.

This relation can be simplified to terms of $R_1$ and $R_3$, for example, where:

$L_1=20\times10^{-6}$ henries $p_0=3.64\times10^7$ radians per second $\alpha_0=0.964$ (transistor current gain at cutoff frequency)

$N=5$ (feedback transformer $T_1$ turns ratio)

$C_c=7.6\times10^{-12}$ farads.

Then the stability criterion becomes $$R_1(1+27.7\times10^{-5}R_3)\leq2.91\times10^3 \qquad (2)$$

and, given a value of load resistance $R_3$, the largest value of resistance $R_1$ for which the oscillator will be unstable can be readily determined. A value for resistance $R_3$ is chosen to yield an advantageous compromise between a value on the one hand that will permit the greatest output power and a value on the other hand that will produce a critical value of resistance $R_1$ well above the total resistance of the internal base electrode resistance and the resistance of diode 27 in its low impedance condition as will be described more fully hereinafter.

Referring once more to Fig. 3 a base biasing resistor 25 having a resistance that is much larger than the reverse conducting resistance of diode 27 and much smaller than the resistance of diode 27 when biased in the high impedance region of its characteristic, as hereinafter described, is connected between base electrode 6 and a positive terminal of a source 26 of direct-current bias potential. The resistance of resistor 25 is also advantageously chosen to be larger than the maximum resistance value of resistor $R_1$ as determined from Equations 1 or 2 above. A breakdown diode 27 of such type, for example, as that described in the United States Patent No. 2,714,702, which issued August 2, 1955, to W. Shockley, is connected between base electrode 6 and another source 28 of direct-current biasing potential. Thus, the transistor input circuit now comprises two series paths, each having an individual portion and each including in common the internal base-emitter circuit of transistor 5 and secondary winding 10. A first series path includes in its individual portion resistor 25 and source 26 connected in series between base electrode 6 and ground while the other series path includes in its individual portion diode 27 and source 28 connected in series between base electrode 6 and ground.

Figure 5:
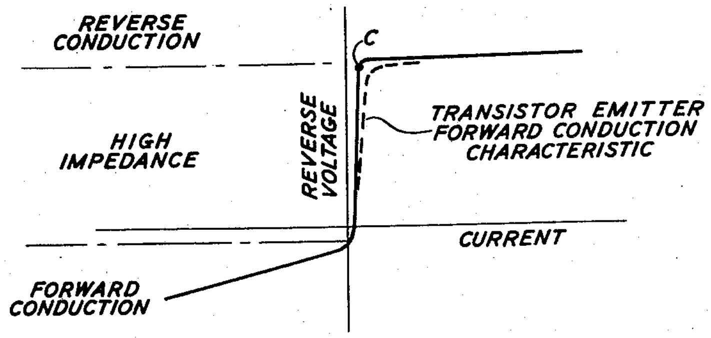
Fig. 5 is a breakdown diode voltage-current characteristic.

A voltage-current characteristic of a typical breakdown diode is illustrated by the solid line curve in Fig. 5 and has a forward conducting region and a reverse conducting region separated by a high impedance region. If the reverse bias, i.e., bias tending to cause reverse conduction, on such diode is increased sufficiently the diode will break into conduction in the reverse direction in an abrupt fashion which is much sharper than the forward conduction characteristic of the transistor emitter diode, which is illustrated for comparison by the dashed curve in Fig. 5. Diode 27 is arranged for forward conduction from base 6 to source 28, and it is reverse biased by source 28 in its high impedance region at point C in Fig. 5 adjacent to its reverse conduction point.

In the blocking oscillator stable conduction condition, diode 27 does not conduct because the reverse bias holds it in its high impedance condition near the reverse breakdown point. Transistor 5 is held in stable conduction as a result of the bias applied to base 6 from source 26 through resistor 25. When the blocking oscillator is triggered in the manner outlined above in connection with Fig. 1, the increased current flow in resistor 25 drops the base potential of transistor 5 low enough to drive breakdown diode 27 into its reverse conduction region. At this point source 28 takes over the supply of operating bias to the base of transistor 5 from source 26 because the reverse conducting resistance of diode 27 is much lower than the resistance of resistor 25. The relatively low resistance in the base circuit represented by the reverse conducting impedance of diode 27 causes the blocking oscillator portion of the regenerative pulse amplifier to be translated into its unstable conducting condition. Pulse regeneration continues thereafter in the manner outlined above in connection with Fig. 1.

The presence of the large resistance represented by resistor 25 has no appreciable adverse effect on oscillator switching time because the conduction of diode 27 effectively removes resistor 25 from the oscillator circuit as soon as regeneration starts.

Although this invention has been explained in connection with particular embodiments thereof, other embodiments of the invention will be apparent to those skilled in the art and are contemplated within the scope of the invention.

What is claimed is:

1. In a circuit for producing a voltage pulse, a transistor including a base, an emitter, and a collector, a load coupled to said collector, a source of a triggering pulse, an inductance, electrical means for charging said inductance in the absence of a triggering pulse, means for applying a pulse from said source to said charging means to effect substantially an interruption thereof to change the charged condition of said inductance, means for coupling said inductance to said emitter to supply a biasing voltage through said coupling means to said emitter in response to said change whereby a voltage pulse is produced in said load, and a feedback circuit for regeneratively coupling said collector to said emitter.

2. In a monostable blocking oscillator, a transistor including a base, an emitter, and a collector, a load coupled to said collector, means connected between said base and emitter to establish a stable condition for said oscillator, an inductance, a source of triggering pulses, means coupling said inductance to said last-mentioned means, a feedback circuit coupling said collector to said emitter, and means for charging said inductance in the absence of a triggering pulse, said source applying a pulse to said charging means for changing the charging of said inductance, said last-mentioned changing of the charge of said inductance supplying a voltage through said coupling means to said emitter to bias said transistor into an unstable condition and thereby institute a regenerative feedback voltage in said feedback circuit for producing a voltage pulse in said load.

3. In combination, a monostable regenerative circuit having input and output connections, said circuit normally having a stable condition at which substantially no voltage is produced at said output connections, an inductance, a source of triggering pulses, voltage means connected to said inductance for establishing a charge on said inductance in the absence of triggering pulses, means responsive to a pulse from said source for effectively disconnecting said voltage means from said inductance and thereby changing the charge on said inductance, said last-mentioned change causing a voltage to be induced in said inductance, and means coupling said inductance to said input connection for supplying said induced voltage thereto for biasing said circuit to an unstable condition thereby initiating a regenerative action in said circuit whereby a voltage pulse is produced in said output connections.

4. In combination, a monostable signal translating circuit having an input circuit and an output circuit, a source of input pulses, means connected in said input circuit for normally maintaining said translating circuit in a stable condition, mutual inductance means, means connecting one winding of said inductance means in said input circuit, means for supplying magnetizing current to another winding of said inductance means to establish a steady magnetic condition thereabout in the absence of an input pulse from said source, and means connected to said magnetizing current supply means and responsive to an input pulse from said pulse source for substantially totally attenuating said magnetizing current in said other winding and thereby changing the steady magnetic condition thereabout, said last mentioned change causing a voltage to be induced in said other winding, said one and other windings coupling said induced voltage to said translating circuit input circuit for triggering said translating circuit into an unstable condition to produce a pulse in said translating circuit output circuit.

5. A pulse regenerating circuit comprising a single-swing transistor blocking oscillator having an input circuit and an output circuit and feedback means coupled therebetween, said oscillator normally being in a quiescent state whereby substantially no voltage is produced in said output circuit, a source of triggering pulses, an inductance, means for supplying charging current to said inductance to establish a steady magnetic condition thereabout in the absence of a triggering pulse, switching means connected to both said pulse source and current supply means and responsive to a triggering pulse from said source for interrupting the supply of charging current to said inductance, said interruption of the charging current to said inductance changing the steady magnetic condition thereabout and thereby causing a voltage to be induced in said inductance, and means including at least a part of said feedback means for intercoupling said oscillator input circuit and said inductance for utilizing the last-mentioned voltage to trigger said oscillator into an active state and thereby initiate the production of a voltage pulse in said oscillator output circuit.

6. A signal translating circuit having input connections and output connections for generating a voltage pulse at said output connections in response to the application of a triggering pulse to said input connections, said circuit including an And circuit which comprises in series a resistor, a diode and a source of potential, an inductance, means including said And circuit for supplying a charging current to said inductance in the absence of a triggering pulse, means for applying a pulse from said input connections to said And circuit for effectively interrupting said And circuit and thereby cutting off the charging current to said inductance, said cutting off of the charging current to said inductance serving to induce a voltage therein, a single-swing transistor blocking oscillator having the output thereof coupled to said output connections and normally being in a quiescent state, and mutual inductance means including said charged inductance for applying said induced voltage to said oscillator to institute an active state therein and thereby initiate the production of a voltage pulse in said output connections.

7. Improved means for applying triggering pulses to a blocking oscillator having input and output circuits, said pulse applying means comprising mutual inductance regenerative feedback means in said blocking oscillator for coupling said input and output circuits, a diode, a source of potential, a resistor, an inductance, means connecting said inductance in series with said resistor and said diode between the terminals of said potential source, said diode being poled for a forward conduction of current from said source of potential to charge said inductance, means for applying one of said triggering pulses to said diode to bias said diode effectively to a non-conduction condition thereby interrupting the flow of charging current through said inductance and inducing an electromotive force in said inductance, and means coupling said mutual inductance feedback means to said inductance for applying said induced electromotive force to said input circuit to produce a voltage pulse in said output circuit.

8. Pulse regenerating means comprising a transistor single-swing blocking oscillator having a base eletcrode, an emitter electrode, and a collector electrode, an input circuit connected between said base and emitter electrodes, an output circuit connected between said base and collector electrodes, a transformer having a primary winding connected in said output circuit and a secondary winding connected in said input circuit for regeneratively coupling said output and input circuits, said blocking oscillator having stable and unstable conditions, means for normally biasing said oscillator in its stable condition, an inductance coupled to said secondary winding, a source of input pulses connected to said inductance, and means including said inductance and said secondary winding for biasing said oscillator into its unstable condition in response to an input pulse from said source, said unstable oscillator having a regenerative voltage established therein through said primary and secondary windings whereby a pulse is produced in said output circuit, said last-mentioned means comprising a source of direct-current, means including said current source for charging said inductance in the absence of said input pulse, and means responsive to an input pulse for disabling said inductance charging means and thereby causing said inductance to induce therein a voltage for said biasing of said oscillator.

9. A monostable regenerative pulse amplifier having stable and unstable conducting conditions and comprising a three electrode signal translating device, a mutual inductance, pulse responsive switching means, means including said switching means for supplying charging current to one winding of said mutual inductance, means for applying pulses to said switching means, means including said pulse responsive switching means for interrupting the supply of charging current to said one winding in response to the application of a pulse to said switching means, an input circuit for said translating device including two series bias circuit each having a common portion comprising another winding of said mutual inductance means and an individual portion connected in series with said another winding between two electrodes of said translating device, the first one of said series bias circuits biasing said amplifier in its stable conducting condition and comprising in its individual portion a resistor and a source of potential, the second one of said series bias circuits comprising in its individual portion a diode and a source of potential for biasing said diode Off, an output circuit for said translating device, and means including said first bias circuit individual portion and said one winding for biasing said diode On and thereby biasing said amplifier into its unstable conduction condition to produce a pulse in said output circuit in response to the interruption of charging current in said one winding.

10. The monostable regenerative amplifier according to claim 9 in which the resistance of said resistor is much larger than the conducting resistance of said diode.

11. The regenerative amplifier according to claim 9 wherein said pulse responsive switching means comprises a rectifier, a resistor, another source of potential, and means connecting said another source of potential, said rectifier, and said switching means resistor in series across the terminals of said one winding, said rectifier being poled for forward conduction of charging current from said another source through said one winding, and said pulse applying means being connected to apply pulses to reverse bias said rectifier thereby interrupting the flow of charging current.

12. In an oscillation generator, a transistor having a base, an emitter, and a collector, means comprising a battery and a unidirectional device connected to said collector for limiting the voltage output thereof, a feedback transformer including three mutually coupled windings, said windings being a primary winding having one terminal connected to said collector, a first secondary winding having one terminal connected to said emitter, and a second secondary winding, said first and second secondary windings each having one terminal grounded, an output transformer including a primary winding and a secondary winding, said output transformer primary winding being serially connected with said first-mentioned primary winding, a load connected to said output transformer secondary winding, a first source of direct-current potential having a positive terminal connected to said serially connected primary windings and a negative terminal to said base, a first input circuit serially connected to said second secondary winding and including a second source of direct-current potential having its positive terminal connected to ground which is also connected to said base and the negative terminal of said first source, said first input circuit including in series the negative terminal of said second source, a first resistor, a second unidirectional device poled in a conductive direction toward said last-mentioned negative terminal, a second resistor, and another terminal of said second secondary winding, a second input circuit connected between a junction of said second unidirectional device and second resistor and the grounded terminals of said first and second sources, said second input circuit including in series a third unidirectional device poled in a conductive direction away from said last-mentioned junction and a source of alternating-current voltage, and a trigger source connected through a fourth unidirectional device to a junction of said first resistor and said second unidirectional device, said fourth unidirectional device being poled in a conductive direction toward said last-mentioned junction.

13. A pulse regenerating circuit comprising a blocking oscillator having a transistor with base, emitter, and collector electrodes, an input circuit, an output circuit, and mutual inductance means having first, second, and third windings, said input circuit connected between said base and emitter electrodes and comprising said first winding, a first source of direct-current potential, and a breakdown diode poled for reverse current flow in the same direction as the direction of forward current flow in the emitter diode of said transistor, said breakdown diode having a conduction characteristic which includes a region of forward conduction and a region of reverse conduction separated by an intermediate region of substantially zero conduction, said first source of direct-current biasing said breakdown diode in its said intermediate zero conduction region at a potential which is slightly less than the potential required to initiate reverse conduction, a base biasing resistor, a second source of direct-current potential, means connecting said base biasing resistor and said second source in a series conduction path which is in parallel with said first winding and the internal base-emitter circuit of said transistor to bias said oscillator normally in stable nonoscillatory conduction, electronic switching means comprising a first rectifier, a resistor, a third source of direct-current potential, and means connecting said first rectifier and switching means resistor in a series circuit with said third source of potential between the terminals of said second winding, said first rectifier being poled for forward conduction of current from said third source through said second winding, means for applying input pulses to said electronic switching means for applying reverse bias to said first rectifier thereby interrupting the flow of current through said second winding from said third source to trigger said oscillator into unstable conduction and produce a pulse in said output circuit, means for controlling the triggering time of said pulse regenerating circuit following the interruption of current from said third source through said second winding comprising a clock source of alternating current potential, a second rectifier, and means connecting said clock source and said second rectifier in series across the terminals of said second winding, said blocking oscillator output circuit comprising said third winding connected in series with said first source of potential and said breakdown diode between said base and collector electrodes, and voltage amplitude limiting means connected to said collector electrode.

14. The pulse regenerating circuit according to claim 13 in which the resistance of said base bias resistor is greater than the value of $R_1$ which satisfies the following relation:

$$\frac{p_0C_cR_1R_3+R_1+p_0L_1(1-\alpha_0N)}{C_cL_1(R_3+(N-1)^2R_1)}=\frac{R_1p_0(1-\alpha_0)}{p_0\tau_1+L_1+C_cR_1R_3}$$

where $\alpha_0$=transistor current gain at cutoff frequency
$p_0=2\pi f_{co}$
$f_{co}$=transistor cutoff frequency
$C_c$=inherent collector electrode capacity
$R_1$=resistance in series with the base electrode
$R_3$=resistance in series with the collector electrode
$L_1$=magnetizing inductance of the first and third feedback transformer windings
$N$=feedback transformer turns ratio
$\tau_1=C_cL_1(R_3+(N-1)^2R_1)$.

15. The pulse regenerating circuit according to claim 13 in which the resistance of said base bias resistor is greater than the value of $R_1$ which satisfies the following relation:

$$R_1(1+27.7\times10^{-5}R_3)=2.91\times10^3$$

where $R_1$ is the resistance in series with the base electrode and $R_3$ is the resistance in series with the collector electrode.

References Cited in the file of this patent

UNITED STATES PATENTS

| | | |
|---|---|---|
| 2,758,208 | Grayson et al. | Aug. 7, 1956 |
| 2,764,688 | Grayson et al. | Sept. 25, 1956 |
| 2,802,118 | Simkins | Aug. 6, 1957 |